United States Patent
Saint-Ramond et al.

(10) Patent No.: US 7,396,592 B2
(45) Date of Patent: Jul. 8, 2008

(54) TARGET FOR VAPORIZING UNDER AN ELECTRON BEAM, A METHOD OF FABRICATING IT, A THERMAL BARRIER AND A COATING OBTAINED FROM A TARGET, AND A MECHANICAL PART INCLUDING SUCH A COATING

(75) Inventors: Bertrand Saint-Ramond, Fontainebleau (FR); Andre Malie, Chatellearault (FR); Christophe Chaput, Limoges (FR); Isabelle Porte, Condat-sur-Vienne (FR); Cyrille Delage, Le Palais sur Vienne (FR)

(73) Assignees: Snecma, Paris (FR); Snecma Services, Paris (FR)

( * ) Notice: Subject to any disclaimer, the term of this patent is extended or adjusted under 35 U.S.C. 154(b) by 0 days.

(21) Appl. No.: 11/953,491

(22) Filed: Dec. 10, 2007

(65) Prior Publication Data
US 2008/0090100 A1    Apr. 17, 2008

Related U.S. Application Data

(62) Division of application No. 10/956,110, filed on Oct. 4, 2004, now Pat. No. 7,335,616.

(30) Foreign Application Priority Data

Oct. 9, 2003    (FI)    .................... 03 11812

(51) Int. Cl.
*B32B 9/00*    (2006.01)

(52) U.S. Cl. ........................ 428/469; 428/472; 428/701; 501/103; 262/62; 262/62.3 R

(58) Field of Classification Search ................. 428/469, 428/472, 701; 501/103; 252/62, 62.3 R
See application file for complete search history.

(56) References Cited

U.S. PATENT DOCUMENTS

| 4,923,830 | A | 5/1990 | Everhart et al. |
| 5,023,217 | A | 6/1991 | Everhart et al. |
| 6,143,437 | A | 11/2000 | Kondou et al. |
| 6,395,381 | B1 | 5/2002 | Kondo et al. |
| 6,645,351 | B2 | 11/2003 | Saint-Ramond et al. |
| 6,808,761 | B2 | 10/2004 | Chaput et al. |
| 7,011,894 | B2 | 3/2006 | Saint-Ramond et al. |
| 7,074,506 | B2 | 7/2006 | Chaput et al. |
| 2005/0064225 | A1 | 3/2005 | Leclercq et al. |

FOREIGN PATENT DOCUMENTS

| DE | 43 02 167 C 1 | 2/1994 |
| EP | 0 812 931 A1 | 12/1997 |
| EP | 0 931 852 A1 | 7/1999 |
| EP | 0 987 345 A1 | 3/2000 |
| EP | 1 055 743 A1 | 11/2000 |
| EP | 1 357 201 A1 | 10/2003 |

OTHER PUBLICATIONS

U.S. Appl. No. 11/944,508, filed Nov. 23, 2007, Leclercq et al.
U.S. Appl. No. 11/953,507, filed Dec. 10, 2007, Saint-Ramond et al.
U.S. Appl. No. 11/953,491, filed Dec. 10, 2007, Saint-Ramond et al.

*Primary Examiner*—Paul Marcantoni
(74) *Attorney, Agent, or Firm*—Oblon, Spivak, McClelland, Maier & Neustadt, P.C.

(57) ABSTRACT

The invention relates to a composite target in the form of a bar made of ceramic powders and designed to be evaporated under an electron beam, the target comprising zirconia and at least one zirconia stabilizer. In characteristic manner, said target is wherein said zirconia stabilizer is at a molar content lying in the range 2% to 30% and wherein said zirconia is formed by more than 90% of a monoclinic phase. The invention is applicable to fabricating a ceramic thermal barrier of low thermal conductivity and high thermomechanical strength formed by evaporation under an electron beam.

8 Claims, No Drawings

TARGET FOR VAPORIZING UNDER AN ELECTRON BEAM, A METHOD OF FABRICATING IT, A THERMAL BARRIER AND A COATING OBTAINED FROM A TARGET, AND A MECHANICAL PART INCLUDING SUCH A COATING

CROSS REFERENCE TO RELATED APPLICATIONS

This application is a divisional of U.S. application Ser. No. 10/956,110 filed on Oct. 4, 2004, now U.S. Pat. No. 7,335,616 all of which claim priority to French Patent Application No. 03 11812 filed on Oct. 9, 2003. The contents of each of these documents are incorporated herein by reference.

The invention relates to a composite target in the form of a bar made up of ceramic powders for the purpose of being evaporated under an electron beam, the bar comprising zirconia and at least one zirconia stabilizer, and the invention also relating to a method of fabricating it.

The present invention also relates to making a thermal barrier having low thermal conductivity and high thermomechanical strength out of ceramic formed by evaporating such a target under an electron beam.

The invention also relates to a ceramic coating comprising such a thermal barrier, and to a superalloy mechanical part including such a coating.

BACKGROUND OF THE INVENTION

The desire to increase the efficiency of turbomachines, in particular in the field of aviation, and also to reduce fuel consumption and polluting emissions of gases and unburned fuel, have led to fuel combustion under conditions that are closer to stoichiometric. This situation is accompanied by an increase in the temperature of the gases leaving the combustion chamber and heading towards the turbine.

Consequently, it has been necessary to adapt the materials used in the turbine to this increase in temperature, by improving techniques for cooling turbine blades (hollow blades), and/or by improving the properties of such materials in terms of their ability to withstand high temperatures. This second technique, in combination with the use of superalloys based on nickel and/or cobalt, has led to various solutions including depositing a coating of thermally insulating material known as a thermal barrier.

Under steady operating conditions and with a part that is cooled, the ceramic coating makes it possible to establish a temperature gradient through the coating with a total amplitude that can exceed 200° C. for a coating that is about 150 micrometers (μm) thick. The operating temperature of the underlying metal forming the substrate for the coating is thus reduced by that gradient, thereby leading to significant savings in the volume of cooling air that is needed, and to significant improvements in the lifetime of the part and in the specific fuel consumption of the turbine engine.

Naturally, in order to improve the properties of the thermal barrier, and in particular its bonding with the substrate, it is possible to include an underlayer between the substrate and the coating. In particular, it is known to make an underlayer constituted by one or more aluminides, comprising in particular a nickel aluminide optionally including a metal selected from platinum, chromium, palladium, ruthenium, iridium, osmium, rhodium, or a mixture of these metals, and/or a reactive element selected from zirconium (Zr), hafnium (Hf), and yttrium (Y), and/or an alloy of the MCrAlY type, where M is a metal selected from nickel, cobalt, iron, or a mixture of those metals.

Usually, ceramic coatings are deposited on the part to be coated either by a spraying technique (in particular plasma spraying), or by a physical vapor deposition technique, i.e. by evaporation, in particular by electron beam physical vapor deposition (EB-PVD) forming a coating that is deposited in an enclosure for vacuum evaporation under electron bombardment).

With a sprayed coating, a zirconia-based oxide is deposited by plasma spraying type techniques, leading to the formation of a coating constituted by a stack of droplets that are molten and then quenched by shock, being flattened and stacked so as to form a deposit that is imperfectly densified and that has a thickness that generally lies in the range 50 μm to 1 millimeter (mm).

A physically deposited coating, and in particular a coating deposited by evaporation under electron bombardment, leads to a coating that is made up of an assembly of columns directed substantially perpendicularly to the surface to be coated, over a thickness lying in the range 20 μm to 600 μm. Advantageously, the space between the columns allows the coating to compensate effectively for the thermomechanical stresses that are due, at operating temperatures, to differential expansion relative to the superalloy substrate, and to centrifugal mechanical stresses due to rotation of the blades. Parts can thus be obtained having long lifetimes when subjected to thermal fatigue at high temperature.

Conventionally, such thermal barriers thus lead to a discontinuity in thermal conductivity between the outer coating of the mechanical part, comprising said thermal barrier, and the substrate of the coating forming the material that constitutes the part.

Usually, it is found that thermal barriers which lead to a large discontinuity in thermal conductivity suffer from a high risk of separation between the coating and the substrate, and more precisely at the interface between the underlayer and the ceramic thermal barrier.

At present, it is desired to obtain thermal barrier compositions which enable mechanical parts to withstand surface temperatures of about 1500° C., i.e. up to about 1300° C. within the substrate. The thermal barriers presently in use enable mechanical parts to withstand surface temperatures of about 1200° C. to 1300° C., i.e. about 1000° C. to 1100° C. within the substrate.

It is known to make use of a thermal barrier that is obtained from a base material constituted by zirconia possessing a coefficient of expansion that is close to that of the superalloy constituting the substrate, and of thermal conductivity that is quite low.

The present invention relates to the type of coating that is obtained by evaporating a target under an electron beam. The targets used are subjected to thermal shock when they are irradiated by the electron beam, which thermal shock can lead to the target breaking, in particular if the target presents defects and/or irregularities. When the target breaks, it is no longer usable in practice, since it is no longer capable of delivering material by evaporation in regular manner.

Patent application EP 1 055 743 relates to a material that can be deposited by electron beam evaporation, in which it is desired to compensate, at least in part, for the change in volume of the material due to the thermal expansion that occurs when the temperature rises due to the irradiation, by means of the 4% volume reduction that is induced by the phase transition between monoclinic zirconia which transforms into tetragonal zirconia as temperature rises from 500°

C. to 1200° C. More precisely, action is taken on a broad distribution of particle sizes for the powder of monoclinic structure so as to ensure that this compensation takes place over a quite broad range of temperature values.

EP 1 055 743 also provides for the presence of monoclinic zirconia at a concentration of 25% to 90%, or preferably in the range 40% to 85%, for the purpose of improving ability to withstand thermal shock. As in DE 4 302 167, this improved resistance to thermal shock comes from the appearance of microcracks during the phase transition between the tetragonal phase and the monoclinic phase while temperature is falling, which microcracks are capable of absorbing the thermal shock energy so as to prevent cracks from propagating, and thus prevent the material from breaking. According to EP 1 055 743, the two above-mentioned roles of the monoclinic zirconia serve to increase resistance to thermal shock.

According to EP 1 055 743, the targets are unusable outside those ranges of values. More precisely, when the monoclinic phase content of the zirconia is less than 25%, thermal expansion during evaporation is compensated to a lesser extent by the volume reduction during phase transformation, and the proportion of microcracks is too small, thereby limiting resistance to thermal shock. When the monoclinic phase content of the zirconia is greater than 90%, the volume expansion induced by the phase change between tetragonal zirconia transforming into monoclinic zirconia during the cooling that follows the temperature rise inherent in evaporation is too great, thereby leading to cracks (seams or quenching cracks) greatly reducing the strength of the target and possibly leading to breakage thereof.

OBJECTS AND SUMMARY OF THE INVENTION

An object of the present invention is to provide a solution that makes it possible to obtain a composite target in the form of a bar constituted by one or more mixtures of ceramic powders including zirconia and at least one zirconia stabilizer, and designed to be evaporated under an electron beam, which can be implemented easily in reproducible manner, giving rise to a target of good quality.

An object of the present invention is thus to enable a ceramic target to be obtained for evaporating under an electron beam in order to obtain a deposited ceramic layer having the same composition as that of the target.

To this end, the present invention provides a composite target in the form of a bar made of ceramic powders for the purpose of being evaporated under an electron beam, the target comprising zirconia and at least one zirconia stabilizer, wherein said zirconia stabilizer is included at a molar content lying in the range 2% to 30%, and wherein said zirconia is formed by more than 90% of a monoclinic phase.

Contrary to the teaching of EP 1 055 743, it has been found, surprisingly, that a content of greater than 90% of monoclinic zirconia is entirely compatible with the looked-for target properties of strength when cold and resistance to thermal shock.

The invention makes it possible to obtain targets having mechanical properties that are optimal for this application, i.e. fairly weak so as to provide good resistance to thermal shock, while nevertheless being strong enough to allow the target to be handled without being damaged.

It has been found that the evaporation behavior of targets presenting the monoclinic phase of zirconia at a content of greater than 90% is less sensitive to variations in other characteristics of the targets, and in particular pore diameter, specific gravity, and porosity.

For example, it has been observed that variations in pore diameter over the range 0.4 µm to 1.5 µm at constant specific gravity, or variations in specific gravity of the range 2.8 to 3.3 at constant pore diameter, lead to results that are identical whether in terms of behavior during deposition by evaporation or in terms of the characteristics of the coatings that are obtained by such deposition.

The above-mentioned variants in the characteristics of targets can arise when changing powder batch, and thus changing mean diameter and specific surface area of the particles in the powder. From one batch of powder to another, small variations in particle size or in specific area are frequently observed.

Thus, by choosing to provide a monoclinic phase of zirconia at a content of greater than 90% in the target, it is possible to use the same method of fabricating targets without modifying fabrication parameters, and in spite of the varying characteristics of the powders used.

Preferably, in the target, said zirconia is formed by more than 98% of a monoclinic phase.

In a preferred disposition, said stabilizer comprises at least one element belonging to the group formed by oxides of rare earth, tantalum oxide, and niobium oxide. In this respect, the term rare earth is used to mean the lanthanides (lanthanum, cerium, praseodymium, neodium, promethium, samarium, europium, gadolinium, terbium, dysprosium, holmium, erbium, thulium, ytterbium, and lutetium), and scandium and yttrium.

Preferably, the specific gravity of the target is less than 3.9, and preferably lies in the range 2.5 to 3.3.

Also preferably, the target presents a mean pore diameter $d_{50}$ of less than 2 µm (preferably lying in the range 0.2 µm to 1.5 µm, and more particularly in the range 0.4 µm to 1.2 µm) with porosity of 30% to 50%.

These two parameters constituted by mean pore diameter and by target specific gravity have an influence on the mechanical strength of the targets, and on their behavior during evaporation, and in particular their resistance to thermal shock. These factors can be controlled by appropriately selecting the initial raw materials and by selecting the fabrication parameters.

The present invention also relates to a target presenting a composition that varies along its height.

The present invention also provides a method of fabricating a composite target in the form of a bar as defined above, made of ceramic powders and for the purpose of being evaporated under an electron beam. According to the invention, the method comprises the following steps:

a) preparing at least a first mixture having a first composition from a binder and a powder comprising zirconia and at least one zirconia stabilizer, said zirconia being formed by more than 90% of a monoclinic phase;

b) introducing said mixture into a mold;

c) compacting the mixture in said mold; and d) baking the compacted mixture at a temperature of less than 1500° C.

The stabilization temperature is a function of the powder system under consideration: it is generally below 1500° C., and preferably lies in the range 900° C. to 1100° C.

The baking temperature should be low enough to conserve a monoclinic phase content of greater than 90% in the target, i.e. to limit the stabilization of the zirconia which is accompanied by bridges being established between the particles of powder, leading to a drop in resistance to thermal shock.

The use of pure zirconia powder, i.e. powder that is not stabilized, during step a) enables targets to be fabricated having a wide variety of compositions and at lower cost. In the trade, zirconias are commonly sold that have been stabilized with the more conventional stabilizing agents constituted by $Y_2O_3$, MgO, CaO, and $CeO_2$ at fixed contents (in particular at 3%, 4%, or 5% molar content for $Y_2O_3$ relative to the quantity of $ZrO_2$). It is expensive to synthesize powders stabilized with other types of stabilizing agent (e.g. rare earth oxides) or with special contents: synthesizing is performed either by chemical means (expensive precursor), or by physical means (calcining a mixture, then grinding and screening in order to obtain the desired grain size range). In addition, using one or more mixtures of raw powders enables the chemical composition to be controlled in all sections along the length of the target, thus making it possible to vary the content of a given compound within the thickness of the coating, depending on requirements. The method thus avoids synthesizing a multitude of stabilized zirconia mixtures in advance when making composite targets made up of a plurality of segments having different compositions.

The binder is preferably aqueous, i.e. including water, but it may also include an organic binder such as polyvinyl alcohol.

In a preferred disposition, said stabilizer comprises at least one element belonging to the group made up of rare earth oxides, tantalum oxide, and niobium oxide. In this respect, the term rare earth is used to mean the lanthanides (lanthanum, cerium, praseodymium, neodium, promethium, samarium, europium, gadolinium, terbium, dysprosium, holmium, erbium, thulium, ytterbium, and lutetium), and scandium and yttrium.

Preferably, said step a) comprises preparing at least one second mixture having a second composition made up of a binder and powders including zirconia and at least one zirconia stabilizer, said zirconia being constituted by more than 90% of a monoclinic phase, and step b) includes introducing the first mixture and the second mixture in succession, so as to obtain a target of composition that varies along its height.

Preferably, said ceramic powders present a mean particle diameter lying in the range 5 μm to 30 μm, or a specific surface area of less than 10 square meters per gram ($m^2/g$), and preferably a specific surface area lying in the range 3 $m^2/g$ to 8 $m^2/g$.

In another disposition, said ceramic powders present a mean particle diameter of less than 5 μm and step a) includes a substep of calcining the powder prior to incorporating it in the binder.

Such a calcining step makes it possible to readjust the grain size of the powder to a value lying in the range 5 μm to 30 μm.

The present invention also provides a ceramic thermal barrier having low thermal conductivity and high thermomechanical strength, formed by evaporating a target of the above-specified type under an electron beam, deposited on a superalloy substrate.

The present invention also provides a ceramic coating comprising a bonding underlayer, a first ceramic layer based on yttrified zirconia containing a molar content of yttrium oxide lying in the range 4% to 12%, and a second ceramic layer formed by a thermal barrier as defined in the preceding paragraph, said first ceramic layer being situated between said bonding underlayer and said second ceramic layer.

Finally, the present invention also provides a mechanical part made of superalloy, including a ceramic coating having a thermal barrier obtained from a target of the above-specified type.

In particular, the following advantageous dispositions can be implemented in accordance with the invention with respect to the mechanical part:

it further includes a bonding underlayer on which said ceramic coating is deposited;

said bonding underlayer is constituted by an alloy suitable for forming a protective alumina layer by oxidation;

said bonding underlayer is constituted by an alloy of the MCrAlY type, where M is a metal selected from nickel, cobalt, iron, and mixtures of these metals;

said bonding underlayer is constituted by a nickel aluminide optionally containing a metal selected from platinum, chromium, palladium, ruthenium, iridium, osmium, rhodium, or a mixture of these metals, and/or a reactive element selected from zirconium (Zr), hafnium (Hf), and yttrium (Y); and/or said ceramic coating further includes, on said underlayer, a ceramic layer based on yttrified zirconia having a molar content of yttrium oxide lying in the range 4% to 12%.

Other advantages and characteristics of the present invention will appear on reading the following description of embodiments of targets that are given in non-limiting manner.

EXAMPLE 1

The target was prepared under the following conditions:
mixing $ZrO_2$ (100% monoclinic, mean particle diameter $d_{50}$=25 μm, and specific surface area of 1.20 $m^2/g$) and $Y_2O_3$ powder (4% molar relative to the quantity of $ZrO_2$, mean particle diameter $d_{50}$=5.16 μm), these powders having purity >99.9%;

adding a binder in the form of polyvinyl alcohol at a content of 3.5% by weight relative to the mixture as a whole;

introducing the mixture into a mold;

applying a pressure of 100 bars (isostatic pressing); and baking at 1300° C. for 1 hour.

The target obtained in that way presented specific gravity of 3.27, a mean pore diameter $d_{50}$=2.04 μm, porosity of 44%, a monoclinic crystal phase content of 91.7%, a thermal expansion coefficient of $6.8\times10^{-2}$, and a total volume shrinkage of 3.7%.

Nevertheless, it was not possible to make any deposit since the target-forming bar cracked on preheating up to 850° C.

EXAMPLE 2

The target was prepared under the following conditions:
mixing $ZrO_2$ (100% monoclinic, mean particle diameter $d_{50}$=16.7 μm, and specific surface area of 4.4 $m^2/g$) and $Y_2O_3$ powder (4% molar relative to the quantity of $ZrO_2$, mean particle diameter $d_{50}$=0.99 μm), these powders having purity >99.9%;

adding a binder in the form of polyvinyl alcohol at a content of 3.0% by weight relative to the mixture as a whole;

introducing the mixture into a mold;

applying a pressure of 1600 bars (isostatic pressing); and baking at 1000° C. for 1 hour.

The target obtained in that way presented specific gravity of 3.11, a mean pore diameter $d_{50}$=0.75 μm, porosity of 44%, a monoclinic crystal phase content of 100%, a thermal expansion coefficient of $0.78\times10^{-2}$, and a total volume shrinkage of 7.4%.

A deposit was made successfully with that bar, creating a ceramic coating forming a thermal barrier.

EXAMPLE 3

The target was prepared under the following conditions:
mixing $ZrO_2$ (100% monoclinic, mean particle diameter $d_{50}$=21.8 μm, and specific surface area of 7.7 $m^2/g$) and Dy$_2$O$_3$ powder (12% molar relative to the quantity of ZrO$_2$, mean particle diameter d$_{50}$=2.97 μm), these powders having purity >99.9%;

adding a binder in the form of polyvinyl alcohol at a content of 4.0% by weight relative to the mixture as a whole;

introducing the mixture into a mold;

applying a pressure of 1600 bars (isostatic pressing); and baking at 1000° C. for 1 hour.

The target obtained in that way presented specific gravity of 3.14, a mean pore diameter d$_{50}$=0.40 μm, porosity of 49%, a monoclinic crystal phase content of 95%, a thermal expansion coefficient of 0.55×10$^{-2}$, and a total volume shrinkage of 9.5%.

A deposit was made successfully with that bar, creating a ceramic coating forming a thermal barrier.

What is claimed is:

1. A ceramic thermal barrier of low thermal conductivity and high thermomechanical strength, comprising:
   a composite target in the form of a bar made of ceramic powders, the target comprising zirconia and at least one zirconia stabilizer, said zirconia stabilizer being included at a molar content lying in a range of 2% to 30%, wherein
   after sintering of the target, said zirconia in the target contains more than 90% of a monoclinic phase,
   the barrier is formed by evaporating the composite target under an electron beam, and
   the barrier is deposited on a substrate made of superalloy.

2. A ceramic coating composition, comprising:
   a bonding underlayer;
   a first ceramic layer based on yttrified zirconia having a molar content of yttrium oxide lying in the range 4% to 12%; and
   a second ceramic layer formed by a thermal barrier of low thermal conductivity and high thermomechanical strength, including
      a composite target in the form of a bar made of ceramic powders, the target comprising zirconia and at least one zirconia stabilizer, said zirconia stabilizer being included at a molar content lying in a range of 2% to 30%, wherein after sintering of the target, said zirconia in the target contains more than 90% of a monoclinic phase, the barrier is formed by evaporating the composite target under an electron beam, and the barrier is deposited on a substrate made of superalloy,
   wherein said first ceramic layer is situated between said bonding underlayer and said second ceramic layer.

3. A mechanical part made of superalloy, comprising:
   a ceramic coating including a thermal barrier obtained from a composite target in the form of a bar made of ceramic powders, the target comprising zirconia and at least one zirconia stabilizer, said zirconia stabilizer being included at a molar content lying in a range of 2% to 30%, wherein
   after sintering of the target, said zirconia in the target contains more than 90% of a monoclinic phase,
   the barrier is formed by evaporating the composite target under an electron beam.

4. A superalloy mechanical part according to claim 3, further including a bonding underlayer on which said ceramic coating is deposited.

5. A superalloy mechanical part according to claim 4, wherein said bonding underlayer is constituted by an alloy suitable for forming a protective alumina layer by oxidation.

6. A superalloy mechanical part according to claim 4, wherein said bonding underlayer is constituted by an alloy of the MCrAlY type, where M is a metal selected from the group consisting of nickel, cobalt, iron, and mixtures of these metals.

7. A superalloy mechanical part according to claim 4, wherein said bonding underlayer is constituted by a nickel aluminide optionally containing a metal selected from the group consisting of platinum, chromium, palladium, ruthenium, iridium, osmium, rhodium, or a mixture of these metals, and/or a reactive element selected from the group consisting of zirconium, hafnium, and yttrium.

8. A superalloy mechanical part according to claim 3, wherein said ceramic coating further includes, on said underlayer, a ceramic layer based on yttrified zirconia having a molar content of yttrium oxide lying in the range 4% to 12%.

* * * * *